(12) United States Patent
Chen et al.

(10) Patent No.: US 9,537,000 B2
(45) Date of Patent: Jan. 3, 2017

(54) SEMICONDUCTOR DEVICE WITH INCREASED SAFE OPERATING AREA

(71) Applicants: Weize Chen, Phoenix, AZ (US); Patrice M. Parris, Phoenix, AZ (US)

(72) Inventors: Weize Chen, Phoenix, AZ (US); Patrice M. Parris, Phoenix, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 632 days.

(21) Appl. No.: 13/792,876

(22) Filed: Mar. 11, 2013

(65) Prior Publication Data

US 2014/0252472 A1    Sep. 11, 2014

(51) Int. Cl.
| | |
|---|---|
| H01L 29/66 | (2006.01) |
| H01L 29/78 | (2006.01) |
| H01L 29/10 | (2006.01) |
| H01L 29/06 | (2006.01) |
| H01L 29/08 | (2006.01) |

(52) U.S. Cl.
CPC ....... *H01L 29/7816* (2013.01); *H01L 29/1083* (2013.01); *H01L 29/66659* (2013.01); *H01L 29/66681* (2013.01); *H01L 29/7835* (2013.01); *H01L 29/0653* (2013.01); *H01L 29/0847* (2013.01)

(58) Field of Classification Search
CPC ............. H01L 27/0878; H01L 29/1095; H01L 29/41766; H01L 29/78; H01L 29/7816; H01L 29/66; H01L 29/66681; H01L 29/66659; H01L 29/7835; H01L 29/1083
See application file for complete search history.

(56) References Cited

U.S. PATENT DOCUMENTS

| | | | |
|---|---|---|---|
| 6,958,515 B2 | 10/2005 | Hower et al. | |
| 8,063,443 B2* | 11/2011 | Cai ................................ | 257/335 |
| 2002/0109184 A1* | 8/2002 | Hower ................ | H01L 29/0878 |
| | | | 257/335 |
| 2005/0067655 A1* | 3/2005 | Shibib et al. .................. | 257/344 |
| 2013/0234246 A1* | 9/2013 | Yang et al. .................... | 257/335 |
| 2013/0270606 A1* | 10/2013 | Chen et al. .................... | 257/183 |
| 2013/0270635 A1* | 10/2013 | Parris et al. ................... | 257/336 |
| 2013/0341717 A1* | 12/2013 | Chen et al. .................... | 257/337 |

(Continued)

OTHER PUBLICATIONS

T. Khan et al., "Rugged Dotted-Channel LDMOS Structure," Electron Devices Meeting, IEDM IEEE International Conference, 4 pages (Dec. 2008).

(Continued)

*Primary Examiner* — Fazli Erdem (57) ABSTRACT

A semiconductor device includes a substrate having a surface, a composite body region disposed in the substrate, having a first conductivity type, and comprising a body contact region at the surface of the substrate and a well in which a channel is formed during operation, a source region disposed in the semiconductor substrate adjacent the composite body region and having a second conductivity type, and an isolation region disposed between the body contact region and the source region. The composite body region further includes a body conduction path region contiguous with and under the source region, and the body conduction path region has a higher dopant concentration level than the well.

20 Claims, 3 Drawing Sheets

(56) References Cited

U.S. PATENT DOCUMENTS

| | | | |
|---|---|---|---|
| 2014/0117446 A1* | 5/2014 | Ren | H01L 29/78 |
| | | | 257/343 |
| 2014/0167144 A1* | 6/2014 | Tsuchiko | 257/329 |
| 2014/0225156 A1* | 8/2014 | Zhan et al. | 257/164 |
| 2014/0252470 A1* | 9/2014 | Chen et al. | 257/337 |
| 2014/0332901 A1* | 11/2014 | Yang et al. | 257/401 |

OTHER PUBLICATIONS

H. Tomita et al., "Wide-Voltage SOI-BiCDMOS Technology for High-Temperature Automotive Applications," Proceedings of the 23$^{rd}$ International Symposium on Power Semiconductor Devices & IC's, pp. 28-31 (May 2011).

* cited by examiner

SEMICONDUCTOR DEVICE WITH INCREASED SAFE OPERATING AREA

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor device is a laterally diffused metal-oxide-semiconductor (LDMOS) transistor device. In an LDMOS device, a drift space is provided between the channel region and the drain region.

Power devices are susceptible to the generation of secondary charge carriers through impact ionization. In an n-channel LDMOS transistor device, electrons may generate additional electron-hole pairs after being accelerated in a region having a high electric field, such as near the drain boundary. If a sufficient number of holes—the secondary charge carriers—are created to raise the potential of the body of the LDMOS transistor device to an extent that the junction with the source is forward biased, activation of a parasitic npn bipolar transistor formed via the source (emitter), body (base), and drain (collector) regions of the LDMOS transistor device can occur. Very large, damaging currents can result via the activation of the parasitic bipolar transistor, an operating condition referred to as "snapback."

LDMOS devices are often characterized by a "safe operating area" in which the operating current and voltage levels are below levels that would result in a snapback event. Attempts to remain within the safe operating area to avoid device destruction or other damage are often undesirably limiting factors for device operation and application.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Embodiments of semiconductor devices with an increased safe operating area (SOA), electronic apparatus including such semiconductor devices, and methods of fabricating such devices and apparatus, are described. The disclosed embodiments may be useful in addressing the challenges arising from the generation of secondary charge carriers in power transistor devices, such as LDMOS and other transistor devices. The disclosed embodiments may provide a suitable (e.g., low impedance) conduction path for the secondary charge carriers, as well as suppress the gain of a parasitic bipolar transistor formed via the source (emitter), body (base), and drain (collector) regions of the LDMOS transistor device. The conduction path may be configured to remove the secondary charge carriers from the device (e.g., the body) and away from the source junction. For instance, the conduction path may provide a better electrical connection to shunt the secondary charge carriers to ground. The removal of the secondary charge carriers may be useful in devices designed to minimize the generation of the secondary charge carriers. While a certain amount of impact ionization still occurs during operation, the slight increase in source resistance resulting from the low impedance conduction path of the disclosed devices may also help reduce the amount of secondary charge carriers generated.

As described below, the disclosed embodiments may include a composite body region configured with one or more regions of higher dopant concentration to provide the conduction path. For instance, for an n-channel LDMOS device, exemplary embodiments of the composite body region may include a more heavily doped well, a p-type lightly doped source/drain or current terminal extension region (e.g., LDD region), or a combination thereof. Other arrangements or combinations of conduction path regions under a body contact and/or a portion of the source may be used.

The composite body region may include one or more conduction path regions having a higher dopant concentration level than a region of the composite body region in which a channel is formed during operation. In some embodiments, the composite body region includes an outer well that laterally extends from a body contact region across a portion of a source region. Alternatively or additionally, the conduction path includes a region under a portion of the source region formed via a source/drain or current terminal extension implantation procedure of a conductivity type opposite that of the source region (e.g., a p-type lightly doped drain (LDD) extension implant).

The lower impedance of the region(s) of the composite body region may effectively reduce the gain of the parasitic bipolar transistor. To further decrease the resistance of the conduction path, in some embodiments, the source region may not include a transition or extension region (e.g., an n-type LDD region) having a conductivity type in common with the source region. For example, an outer portion of the source region (e.g., distal from the channel) may not include an LDD region, while the inner portion of the source region (e.g., proximate the channel) may still include an LDD region. In other cases, the disclosed devices may be configured as described below such that the source region entirely lacks an LDD region. The lack or reduced presence of a common conductivity type LDD region may thus avoid offsetting the higher dopant concentration level of a portion of the conduction path.

The conduction path region(s) of the composite body region may be configured to avoid reaching the channel of the device (e.g., as a result of lateral diffusion arising from subsequent heat during the fabrication process). For example, the conduction path region(s) may be contiguous with a portion of the source region to be as close as possible to the gate (and, thus, channel) without risk of being disposed under the gate (and, thus, in the channel).

While the presence of the region(s) nearby or along the source region may increase the on-resistance of the device (through, e.g., an increased source resistance), the effect on device performance has been found to be minimal. The current levels of the disclosed devices for a given gate bias voltage do not decrease significantly. Furthermore, any such decrease in current capability may be compensated or addressed through a minimal increase in device size. In contrast, the improved SOA of the device is not achievable through such minimal increases in device size, and thus outweighs any such decrease in current capability. The increased SOA resulting from the lower impedance of the conduction path for the secondary charge carriers may thus be achieved with minimal detrimental impact on device operation.

The increased SOA may also be achieved without requiring additional process steps to the fabrication process. The regions of higher dopant concentration level in the composite body region may be formed via implantation procedures already available or included in the fabrication process flow. For example, the outer well that extends across a portion of the source region may be formed via a low-voltage p-type well implant configured to form a p-type well for a different type of transistor device, such as a non-power (e.g., logic) MOSFET (e.g., CMOS) transistor device. The current terminal extension region of opposite conductivity type may be formed via a p-type LDD implant used to form LDD regions for source and/or drain regions of p-channel transistor devices.

Although described below in connection with n-channel LDMOS transistors, the disclosed devices are not limited to any particular transistor configuration. For instance, application of the features of the disclosed devices is not limited to LDMOS or other power MOS devices. One or more features of the disclosed devices may be applied to other power device configurations. The conduction path region(s) of the composite body region of the disclosed devices may be useful in a wide variety of power electronic devices. The conduction path region(s) are also not limited to any one particular type of LDMOS configuration. For instance, the disclosed devices may have drift regions with various types of reduced surface field (RESURF) arrangements, including single, double, or other RESURF structural arrangements.

N-channel LDMOS devices and, thus, p-type conduction path regions are described and illustrated herein. While the improvements in SOA may be more beneficial in connection with n-channel devices (due to, e.g., less impact ionization in p-channel devices from the lower mobility of holes), the disclosed embodiments are not limited to n-channel devices. P-channel and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

Figure 1:
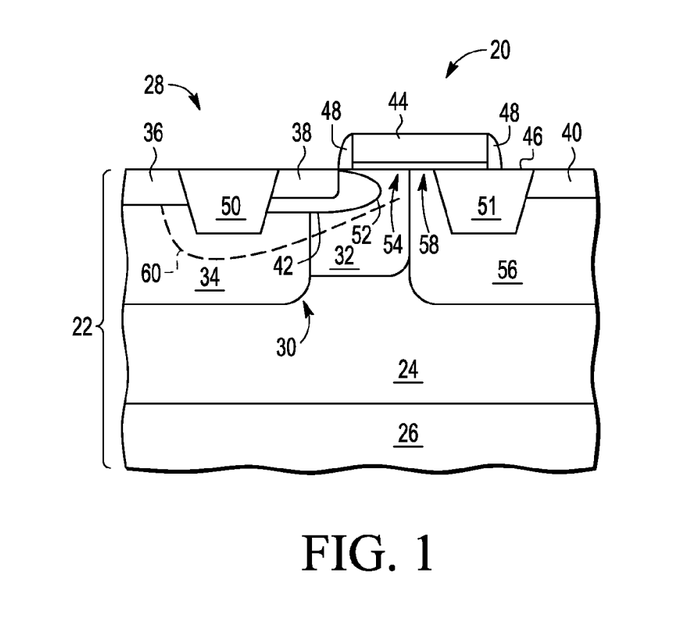
FIG. 1 is a cross-sectional, schematic, partial view of an exemplary semiconductor device with a composite body region configured to provide an increased safe operating area (SOA) in accordance with one embodiment.

FIG. 1 is a schematic cross-sectional view of an example of an n-channel LDMOS device 20 constructed in accordance with one embodiment. The device 20 includes a semiconductor substrate 22, which may, in turn, include a number of epitaxial layers 24. In this example, the semiconductor substrate 22 includes a single p-type epitaxial layer 24 grown on an original substrate 26. The original substrate 26 may be a heavily doped p-type substrate in some cases, such as those having multiple epitaxial layers. The device 20 may alternatively or additionally include non-epitaxial layers in which one or more device regions are formed. Any one or more of the layers of the semiconductor substrate 22 may include silicon. Alternative or additional semiconductor materials may be used in other embodiments. The structural, material, and other characteristics of the semiconductor substrate 22 may vary from the example shown. For example, the semiconductor substrate 22 may include a silicon-on-insulator (SOI) construction. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

A portion of a device area 28 of the device 20 is depicted in FIG. 1. For some embodiments, only one side, half, or other portion of the device area 28 is shown. For example, the device area 28 may be laterally symmetrical and, thus, include a portion that mirrors the portion shown. In other embodiments, the single gate portion of the device area 28 shown in FIG. 1 may be replicated any number of times (e.g., 10, 20, or more times). The device area 28 may be defined by one or more doped device isolating layers or regions (not shown) in the semiconductor substrate 22 (e.g., the epitaxial layer 24). The doped isolating layer(s) or region(s) may laterally and/or otherwise surround the device area 28. These layers or regions act as a barrier or isolation layer separating the device area 28 from the rest of the substrate 22 (or the original substrate 26). In some cases, a buried n-type layer may be formed or disposed in the semiconductor substrate 22. For example, the buried n-type layer may be formed in the semiconductor substrate 22 before the growth of the epitaxial layer 24 thereof. The buried n-type layer may extend laterally across (e.g., under) the device area 28 to act as a barrier or isolation layer separating the active area 28 from the original substrate 26. The buried n-type layer may constitute one of multiple doped device isolating regions (not shown) surrounding the device area 28. For example, a moderately or heavily doped n-type isolation well (not shown) may laterally surround the device area 28. The isolation well may be ring-shaped. The isolation well may be disposed on or otherwise above the buried n-type layer and outside of, or along, the lateral periphery of the device area 28. One or more of the above-described isolating regions may have a dopant concentration level and/or be otherwise configured for high voltage (HV) operation, including punch-through prevention. Any number of the device isolation wells, sinks, or buried layers may be connected to one another. Additional, fewer, or alternative device isolation layers or regions may be provided in the semiconductor substrate 22.

The device 20 includes a device body or body region 30 in the semiconductor substrate 22. The body region 30 is a non-uniform or composite body region to provide one or more conduction path regions to remove secondary charge carriers as described herein. In this embodiment, the composite body region 30 includes multiple p-type wells formed in the epitaxial layer 24 of the substrate 22. In this example, the multiple wells include an inner well 32 and an outer well 34. The inner well 32 may be configured for high voltage operation. For example, the inner well 32 may have a dopant concentration level low enough to avoid an undesirably low drain-to-body breakdown voltage level. As described herein, the outer well 34 may have a higher dopant concentration level than the inner well 32 to establish a conduction path having a lower impedance for the secondary charge carriers.

The body region 30 may be biased via one or more heavily doped p-type body contact regions or electrodes 36 disposed in or otherwise above or adjacent to the outer well 34. The dopant concentration of each contact region 36 may be at a level sufficient to establish an ohmic contact backend metallization (not shown).

The device 20 includes heavily doped source and drain regions 38 and 40 in the semiconductor substrate 22. The source and drain regions 38 and 40 are laterally spaced from one another in the lateral dimension shown in the cross-section of FIG. 1. In some embodiments, the source and drain regions 38 and 40 may have additional or alternative lateral spacing. Any number of source or drain regions 38, 40 may be provided. In some embodiments, the drain region 40 is centered or otherwise disposed between, or laterally surrounded by, the source region 38. In this example, the source and drain regions 38 and 40 are n-type doped portions of the epitaxial layer 24. The heavily doped n-type source region 38 is laterally spaced from the body contact region 36 along the lateral dimension shown in FIG. 1.

The source region 38 is formed within or disposed adjacent the composite body region 30. In this embodiment, the outer well 34 is contiguous with a portion of the source region 38 to position the conduction path for the secondary charge carriers as close as possible to the source region 38 without dopants laterally reaching or disposed under a gate structure described below. In some cases, the outer well 34 may border a lower boundary 42 of the source region 38. In this example, the source region 38 is positioned such that the outer well 34 laterally overlaps with a portion of the source region 38. A remainder of the source region 38 laterally overlaps the inner well 32 of the composite body region 30.

In an alternative embodiment, a portion of the conduction path for the secondary charge carriers may reach or otherwise extend under the gate such that the conduction path affects the threshold voltage Vt of the device 20, which may help set the threshold voltage in a desirable way. An example is shown via a dotted line within the composite body region depicted in FIG. 3. The dopants may be disposed under the gate via a certain amount of lateral diffusion. Such dopant diffusion or positioning may be useful. For example, to be cost competitive, both the inner well 32 and outer well 34 may be optimized for other devices on the same chip, but may not be optimum for the device 20. By allowing a certain amount of dopants from the outer well 34 to diffuse and complement the inner well 32 under the gate near the source side, the body region 30 includes a region that falls in between the two existing wells that may be more desirable for the device 20 (e.g., the region between the dotted line of FIG. 3 and the inner boundary of the outer well depicted therein). In some cases, the dopant concentration of the channel may end up having a lateral gradient (e.g., a graded channel) that may provide an added benefit.

The heavily n-type doped drain region 40 is spaced from the composite body region 30 in the lateral dimension shown in FIG. 1. Such spacing defines a conduction path for the primary charge carriers of the device 20. The conduction path may thus be oriented along the lateral dimension shown in FIG. 1. In a typical LDMOS configuration, the drain region 40 is biased at a relatively high drain-source voltage, Vds, relative to the source region 38 to support the flow of the primary charge carriers along the conduction path. The source and drain regions 38, 40, or respective portions thereof, may have a dopant concentration at a level sufficient to establish ohmic contacts for biasing the source region 38 and the drain region 40. Upon application of the drain-source voltage (and a suitable gate bias voltage), the primary charge carriers (e.g., electrons) flow along the conduction path from the source region 38 to the drain region 40.

The device 20 includes one or more gate structures 44 formed on or above a surface 46 of the semiconductor substrate 22. The gate structure 44 is disposed between the source region 38 and the drain region 40. In some embodiments, the gate structure 44 surrounds the drain region 40, which may be centrally or internally disposed within the device area 28. Alternatively, the gate structure 44 may be arranged in a dual gate finger configuration in which two transistors are symmetrically arranged to share the same drain region 40. Other multiple gate finger embodiments having any number of gate fingers are possible, including embodiments in which body contacts are shared by adjacent fingers. The gate structure 44 includes a gate dielectric layer on the surface 46. For example, the gate dielectric layer may include silicon dioxide (or oxide) deposited or otherwise formed on the surface 46. Each gate structure 44 includes a conductive gate layer (e.g., a polysilicon plate) on or above the gate dielectric layer, which insulates the conductive gate layer from the semiconductor substrate 22. The gate structure 44 may include one or more dielectric sidewall spacers 48 disposed along lateral edges of the gate structure 44. The sidewall spacers 48 may cover the lateral edges to act as a silicide blocker to prevent a silicide short along the surface 46. The sidewall spacers 48 may provide spacing to separate the conductive components of the gate structure 44 from the source region 38 and other regions of the device region 28. In this example, one of the sidewall spacers 48 is used for alignment purposes in defining an edge of the source region 38.

The configuration of the gate structure 44 may vary. For example, the configuration of the gate structure 38 may include multiple conductive layers (e.g., polysilicon plates). Other characteristics, such as the components, materials, and shape, of the gate structure 44 may vary from the example shown.

A number of shallow trench isolation (STI) regions 50 may be formed at the surface 40 in the semiconductor substrate 22. In this embodiment, an STI region 50 is disposed between the body contact region 36 and the source region 34. Another STI region 51 spaces the gate structure 44 from the high voltage applied to the drain region 40. The STI region 51 may be configured to prevent or minimize hot carrier injection (HCI) into the oxide layer of the gate structure 44.

Other STI regions may be disposed in the semiconductor substrate 22 to isolate or separate various contact regions, such as other regions for biasing components of the device 20. For example, an isolation contact region and a substrate contact region may be separated by one of the STI regions 50.

The device 20 may include one or more lightly or intermediately doped transition or source/drain extension regions (e.g., n-type lightly doped drain, or NLDD, regions) or other current terminal extension regions at or near the source and drain regions 38 and 40. In the embodiment of FIG. 1, the source region 38 has an NLDD region 52 adjacent the heavily doped portion of the source region 38. Each current terminal extension region may be or include a diffused region formed in connection with the source region 38 and/or the drain region 40. The diffused region may extend under the gate structure 44 as shown. The current terminal extension regions may assist in controlling the electric field at or near the surface 46, including in areas other than those areas near the source region 38 or the drain region 40. The NLDD region 52 may be considered a portion of the source region 38. The lower boundary 42 of the source region 38 may be defined by the NLDD region 52. The NLDD region 52 may extend laterally under the gate structure 44 as shown.

When the gate structure 44 is biased, charge carriers (in this case, electrons; alternatively, holes) accumulate in one or more channel areas or regions 54. Each channel region 54 (or a portion thereof) may be formed during operation in the inner well 32 of the body region 30 under the gate structure 44. In this example, the accumulation of electrons results in charge inversion in the channel region 54 from the p-type inner well 32 to an n-type conduction layer or area (or other n-channel) near the surface 46 of the semiconductor substrate 22. Once a sufficient amount of the charge carriers accumulate in the conduction layer or area, charge carriers are capable of flowing from the source region 38 toward the drain region 40 through the channel region 54.

The channel region 54 may include other regions or areas in the semiconductor substrate 22 in which charge inversion or accumulation occurs as a result of the bias applied to the gate structure 44. Charge carriers may also accumulate outside of or beyond the body region 30. For example, charge carriers may accumulate in a region of the epitaxial layer 24 adjacent the body region 30. This area and the channel region 54 may form part of the conduction region or path of the device 20 for the primary charge carriers (e.g., electrons). The conduction path may thus be referred to as a primary conduction path or region.

The primary conduction path of the device 20 is not limited to regions in which charge inversion occurs or to regions in which conduction is enabled or enhanced via the bias voltage applied to the gate structure 44. The primary conduction path or regions of the device 20 are thus not limited to regions at or near the surface 40. For example, the primary conduction path includes a portion of a drift region 56 through which charge carriers drift to reach the drain region 40. In this example, the drift region 56 corresponds with a portion of an n-type well under the STI region 50.

The n-type well of the drift region 56 may laterally extend under the gate structure 44 to form an accumulation region 58 of the device 20. The accumulation region 58 may be disposed along the surface 46 rather than under the STI region 50. During operation, charge carriers accumulate in the accumulation region 58 before drifting through the drift region 56. The primary conduction path of the device 20 may include additional or alternative areas or regions having a different conductivity type than the body region 30.

In the embodiment of FIG. 1, the drift region 56 is configured as a field drift region. The STI region 51 is disposed between the accumulation region 58 and the drain region 40. Alternative or additional field isolation structures may be disposed between the accumulation region 58 and the drain region 40. The field isolation structures may include one or more field plates disposed above the surface 46. The device 20 need not include the STI region 51 along the drift region 56, and may thus be configured as an active drift device in alternative embodiments.

The primary conduction path or regions of the device 20 may include still other regions, whether n-type or p-type, at or near the surface 40. For example, the channel region 54, the drain region 40, and/or other conduction region of the device 20 may include one or more additional LDD, transition, or source/drain or current terminal extension regions (e.g., in addition to the NLDD region 52 described above) in the semiconductor substrate 22.

The path along which the charge carriers flow from the source region 38 to the drain region 40 passes through the drift region 56 in the semiconductor substrate 22. The drift region 56 may be configured to allow the charge carriers to drift under the electric field established by the drain-source voltage applied between the drain region 40 and the source region 38. The drift region 56 (or one or more portions thereof) thus forms part of the conduction path of the device 20. During operation, the drift region 56 electrically couples the drain region 40 to the channel region 54 and the source region 38.

The composite body region 30 establishes a conduction path 60 for the secondary charge carriers created via impact ionization along the primary conduction path. The conduction path 60 for the secondary charge carriers may accordingly be referred to as a "secondary conduction path" herein. An example of the secondary conduction path 60 is shown in FIG. 1 with the understanding that the secondary charge carriers may move along a different path. The secondary conduction path 60 may include or pass through one or more body conduction path regions having a higher dopant concentration level than the inner well 32 (or other region in which a channel is formed during operation). The higher dopant concentration level establishes a lower impedance path for the secondary charge carriers. One or more of the body conduction path region(s) may be contiguous with and under the source region 38. The lower impedance path may thus be positioned sufficiently near the source region 38 to remove the secondary charge carriers from the vicinity of the junction between the source region 38 and the body region 30. In the embodiment of FIG. 1, the composite body region 30 includes a single body conduction path region contiguous with and under the source region 38, namely the outer well 34. In this and other embodiments, the outer well 34 may extend across about one-half of the source region 38. The one-half (or other portion) of the source region 38 overlapped by the outer well 34 corresponds with the half (or other portion) of the source region 38 positioned distal from the channel 54.

The partial lateral overlap of the outer well 34 and the source region 38 may position the higher dopant concentration level of the outer well 34 closer to the edge of the gate structure 44 than to the interface between the source region 38 and the STI 50. Such positioning provides the improved body connection that lowers the gain of the parasitic bipolar transistor. In some examples, a lateral spacing between an inner boundary of the outer well 34 and the channel 54 falls in a range from about 0.1 µm to about 0.3 µm. Other spacing distances may be used.

The lower impedance of the body conduction path region(s) may be provided without adding a process step or act to the fabrication process. Each region of the composite body region 30 may be formed via implantation procedures already present in the fabrication process flow. For example, the outer well 34 may be formed via an implant configured to form a well in a low voltage transistor device, such as a well for a transistor body.

Figure 2:
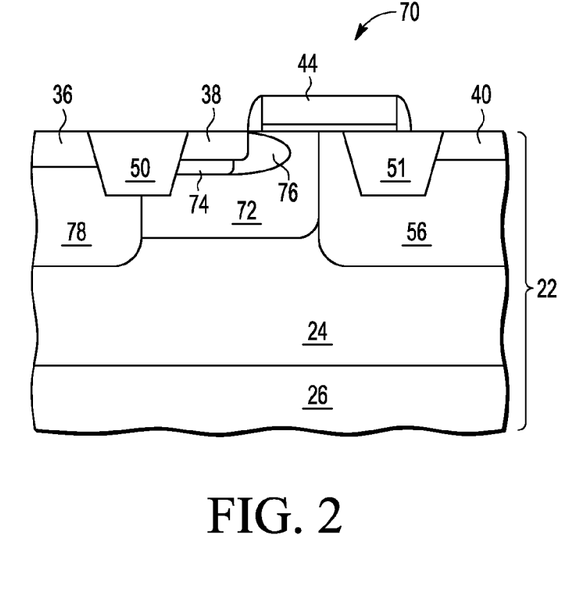
FIG. 2 is a cross-sectional, schematic, partial view of another exemplary semiconductor device with a composite body region configured to provide an increased SOA in accordance with one embodiment.

FIG. 2 depicts a semiconductor device 70 having an alternative secondary conduction path with at least one body conduction path region with a dopant concentration level higher than an inner well 72 in which a channel is formed during operation. In this embodiment, the secondary conduction path includes a body conduction path region 74 contiguous with and under the source region 38. The body conduction path region 74 is configured differently than the body conduction path region of the embodiment of FIG. 1. In this embodiment, the body conduction path region 74 is configured as a source offset region disposed adjacent and under the source region 38. The body conduction path region 74 may be positioned and/or otherwise configured to counter-dope the dopant (e.g., n-type dopant) of the source region 38 (and/or an extension thereof). For example, the body conduction path region 74 may be positioned and/or otherwise configured to counter-dope a portion of the dopant of a source/drain or current terminal extension region 76 (e.g., an n-type LDD region). The counter-doped portion of the current terminal extension region 76 is spaced from the channel and disposed adjacent and under the source region 38.

The counter-doping of the body conduction path region 74 may be achieved via an implantation procedure already available in the fabrication process. For example, the implantation procedure may be configured to form a transition or extension region, which may be formed via a process similar to those used to form the above-described source/drain or current terminal extension regions, but with an implantation of an opposite conductivity type (e.g., p-type) than the source region 38. Such regions may be referred to herein as opposing source/drain extension regions or opposing source extension regions due to their proximity to the source region. The opposite source/drain extension implant may be already available for use in connection with fabricating a p-channel LDMOS transistor or other high voltage or power FET device. For example, the implant may be used in connection with forming a p-channel, high voltage device having a dual gate oxide. The mask opening for the body conduction path region 74 is configured to expose only the counter-doped portion rather than the area that typically corresponds with an LDD or other source/drain or current terminal extension. For instance, the implant may thus not use the gate structure 44 for alignment on the channel side.

The body conduction path region 74 is not limited to embodiments in which counter-doping occurs. In such cases, the impedance-lowering effects of the body conduction path region 74 may be enhanced, insofar as the dopant need not counter-dope the dopant of the source/drain or current terminal extension region 76. For example, the device 70 need not include the source/drain extension or current terminal region 76. The area of the body conduction path region 74 may not be doped by an n-type implantation procedure. In another example, an LDD implant may be configured such that a lower boundary of the extension region 76 reaches about the same depth (or a shallower depth) as the remainder of the source region 38, such that the extension region 76 only extends beyond the source/drain implant in a lateral direction (e.g., under the gate structure 44). Alternatively or additionally, the lateral extent of the extension region 76 is modified from the example of FIG. 1. For example, the extension region 76 may be disposed under the source region 38, but only laterally extend across a portion of the source region 38. The extension region 76 may thus not reach the STI region 50. In some cases, the extension region 76 may be configured to end at about the position that the body conduction path region 74 begins. However, the borders of the body conduction path region 74 and the extension region 76 need not be line-on-line. For example, there may be a gap between the body conduction path region 74 and the extension region 76.

The secondary conduction path of the disclosed embodiments may also include one or more body conduction path regions not adjacent to or under the source region 38. Such regions may nonetheless help remove secondary charge carriers via the body contact region 36 as a result of a dopant concentration level higher than the inner well 72. In the embodiment of FIG. 2, the secondary conduction path includes an outer well 78 adjacent the body contact region 36. Unlike other embodiments described herein, the outer well 78 does not laterally extend across a portion of the source region 38. The outer well 78 is instead configured to laterally extend from the body contact region 36 across a portion of the STI region 50 disposed between the body contact region 36 and the source region 38. In this example, the outer well 78 extends across about one-half of the lateral width of the STI region 50. The extent to which the outer well 78 extends across the STI region 50 may vary. For example, the outer well 78 may extend farther inward such that the boundary between the inner and outer wells 72, 78 is closer to the source region 38 than the body contact region 36.

Other regions of the semiconductor device 70 may be configured similarly to the example described and shown in connection with FIG. 1. For example, the drain-side components of the semiconductor device 70, including, e.g., the drift region 56, the STI region 51, and the drain region 40, may be similarly configured. The semiconductor substrate 22 and the gate structure 44 may also be similarly configured.

Figure 3:
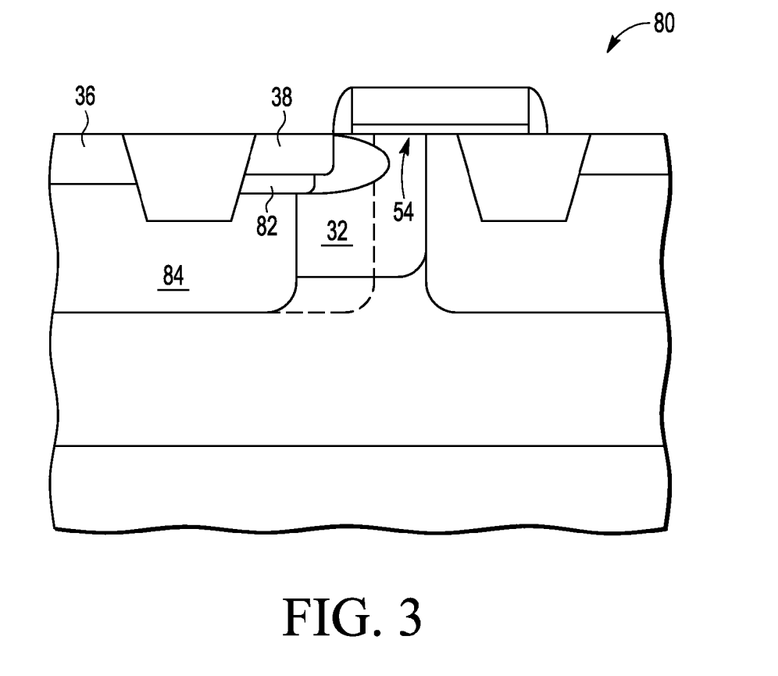
FIG. 3 is a cross-sectional, schematic, partial view of yet another exemplary semiconductor device with a composite body region configured to provide an increased SOA in accordance with one embodiment.

FIG. 3 depicts a semiconductor device 80 with a secondary conduction path having multiple body conduction path regions having a higher dopant concentration level than the inner well 32 in which the channel region 54 is formed during operation. The multiple body conduction path regions are disposed along a secondary conduction path that begins near the channel region 54 and ends at the body contact region 36. Starting from the channel, the secondary conduction path includes a first body conduction path region 82 adjacent and under the source region 38. The first body conduction path region 82 may be configured as a source offset region or an opposing source extension region formed via a source/drain or current terminal extension implant of a conductivity type opposite that of the source region 38, as described above in connection with FIG. 2. The secondary conduction path further includes a second body conduction path region 84, which may be configured as a well like the outer well 34 described and shown in connection with FIG. 1. The extent to which the well region of the second conduction path region 84 laterally extends across the STI region 50 and/or partially across the source region 38 may vary as described above. In this embodiment, the second body conduction path region 84 laterally extends across the STI region 50 and a portion of the source region 38 to overlap or reach the first body conduction path region 82. The second body conduction path region 84 may thus electrically couple the first body conduction path region 82 and the body contact region 36. Alternatively, one or more additional body conduction path regions may be disposed between the body contact region 36 and the second body conduction path region 84.

The above-described source offset regions (e.g., the first body conduction path region 82) may be useful in embodiments in which a body contact region and a source region are not separated by an STI region (or other isolation region). The STI region may not be present in some cases. The lateral width of the STI region increases the distance traveled by the secondary charge carriers before reaching the body contact region. The additional distance may result in a reduction in the SOA for the device. Thus, in some cases (e.g., when the p-type source extension region compresses or otherwise offsets the source region), the body contact region may be adjacent to, or contiguous with, the source region. Without any separation between the body contact and source regions, a heavier doped, outer well may laterally overlap the source region as described above (see, e.g., the second body conduction path region 84). In cases having such overlap, the extent of the lateral overlap may be lower than the overlap in the above-described embodiments to minimize the risk of dopant reaching the channel (e.g., under the gate) as a result of diffusion (e.g., subsequent process heat) and/or process misalignment. In contrast, the use of a source/drain or current terminal extension implant to form the source offset region under the source region as described above may avoid the risk because very little heat is applied or present after the LDD implant. For example, a rapid thermal anneal (RTA) procedure (e.g., only 10 to 30 seconds) may be implemented to activate the dopants and remove implant damage, but not to cause dopant redistribution through diffusion. In contrast, in the case of a well implant, there is usually more heat involved to anneal out implant damage. Alternatively or additionally, the risk may be avoided because the LDD implants use masking procedures in which the dimensions and alignment are closely monitored and controlled for better resolution and alignment. The implant may also be of much lower energy, such that the photoresist may be much thinner than that used in the well implants. The thinner photoresist may provide better control of the photoresist and the dimension(s). LDD implants may also be sufficiently shallow such that the implants do not penetrate the STI regions or the gate polysilicon, which consequently act as hard masks.

The source regions of the above-described embodiments need not include a source/drain or current terminal extension region or have one associated therewith. The source regions need not include an extension or transition region that extends laterally outward (e.g., toward or into the channel) or that extends under the region doped by the source/drain implant. For instance, the embodiments described and shown in connection with FIGS. 1-3 need not have a source/drain or current terminal extension, such as the n-type LDD regions 52, 76. In such cases, the spacers 48 may be less wide to allow the source implant to laterally diffuse under the spacer 48. Alternatively or additionally, a tilt implant may be used for the source region. The absence (or reduced presence) of an extension region of the same conductivity as the source region 38 may enhance the effects of the secondary conduction path presented by the body conduction path region(s). In the n-channel devices described herein, the removal of the n-type LDD dopant near or along, e.g., the outer portion of the source region may maximize the net p-type doping concentration level under that portion of the source region. Without the n-type doping of the LDD region to counteract or offset the p-type doping of the body conduction path region(s), the effective size and doping of the secondary conduction path increases. In contrast, the size of the source region 38 may decrease.

The effective reduction of the source region may increase the source resistance of the disclosed semiconductor devices, thereby lowering device conduction. For example, the on-resistance of the disclosed devices may increase about 2%. The resulting decrease in conduction, however, is slight, and may be compensated or addressed by a small increase in device size. In contrast, the improved SOA (e.g., 4-6 Volts) of the disclosed semiconductor devices cannot be achieved by such device size increases. The SOA improvement may be achieved without detrimental changes to threshold voltage or body effect.

The above-described composite body regions may include a single, uniform well region rather than the dual well embodiments shown in FIG. 1-3. The disclosed embodiments are thus not limited to composite body regions having an inner well and an outer well. For example, alternative embodiments may have a composite body region having a single well and one or more source offset regions (e.g., opposing source extension or LDD regions having a conductivity type in common with the single well). Alternatively or additionally, the composite body region may include one or more opposing LDD or other opposing source extension regions not adjacent the source region. For example, a p-type LDD region may be disposed adjacent the body contact region.

The above-described body conduction path regions provide a better conduction path for the secondary charge carriers generated as a result of impact ionization. The body conduction path regions may be useful in semiconductor devices in which design features to minimize impact ionization are not available. The body conduction path regions may also be useful in semiconductor devices designed to minimize impact ionization, as some level of secondary charge carriers are typically always generated. The body conduction path regions provide a good or improved conduction path for such secondary charge carriers. The presence of the improved conduction path may prevent a gradual increase in the body potential and lower the gain (or emitter efficiency) of the parasitic bipolar transistor. The gain may be minimized or reduced to a level that avoids compromising device performance by adjusting the lateral extent and/or dopant concentration level of one or more of the body conduction path regions.

The above-described body conduction path regions may reduce the gain of the parasitic bipolar transistor and provide other benefits without risk of changing the threshold voltage (Vt) of the semiconductor device. The body conduction path regions are configured to avoid dopant reaching a lateral position under the gate. In some cases, a spacing between the body conduction path regions and the channel acts as a safety margin for any possible lateral diffusion or misalignment. The safety margin may be lower in embodiments having a lower amount of heat subsequently applied during the fabrication process and/or having a lower amount of error in photolithographic alignment. Alternatively or additionally, the lateral width of the source region may be increased to provide further spacing, but at the expense of an area penalty in overall device size.

The above-described devices are shown in simplified form. For example, FIGS. 1-3 do not show the conductive (e.g., ohmic) contacts and other metal layers configured for electric coupling with the source regions, the drain regions, and the gate structures. The devices may have a number of other structures or components for connectivity, isolation, passivation, and other purposes not shown in the figures for ease in illustration. For instance, the devices may include any number of additional doped isolating regions (e.g., an isolation ring) or layers (e.g., a buried isolation layer). In some examples, another p-type epitaxial layer (not shown) may be disposed between the original substrate and the device area. One or more further STI regions, other isolation trenches, and/or isolation wells (not shown) may be provided to isolate the device area and/or other region of the device.

The dopant concentrations, thicknesses, and other characteristics of the above-described semiconductor regions in the semiconductor substrate 22 may vary. In one example of the embodiment shown in FIGS. 1-3, the above-referenced semiconductor regions may have the following approximate concentrations and thicknesses:

|  | Concentration | Thickness |
|---|---|---|
| epitaxial 24: | $1 \times 10^{13}$-$1 \times 10^{15}$/cm$^3$ | 3-10 µm |
| substrate 26: | $1 \times 10^{15}$-$1 \times 10^{19}$/cm$^3$ | not applicable |
| well 32, 72: | $1 \times 10^{15}$-$5 \times 10^{17}$/cm$^3$ | 0.5-2.0 µm |
| well 34, 78, 84: | $1 \times 10^{16}$-$1 \times 10^{18}$/cm$^3$ | 0.5-2.0 µm |
| contact 36: | $1 \times 10^{21}$-$5 \times 10^{21}$/cm$^3$ | 0.15-0.25 µm |
| source 38: | $1 \times 10^{21}$-$5 \times 10^{21}$/cm$^3$ | 0.15-0.25 µm |
| drain 40: | $1 \times 10^{21}$-$5 \times 10^{21}$/cm$^3$ | 0.15-0.25 µm |
| NLDD 52: | $5 \times 10^{17}$-$1 \times 10^{19}$/cm$^3$ | 0.1-0.3 µm |
| drift 56: | $1 \times 10^{15}$-$5 \times 10^{17}$/cm$^3$ | 0.5-2.5 µm |
| PLDD 74, 82: | $5 \times 10^{17}$-$1 \times 10^{19}$/cm$^3$ | 0.15-0.3 µm |

The concentrations and thicknesses may be different in other embodiments. For example, the dopant concentration of the original substrate 26 may vary considerably.

Figure 4:
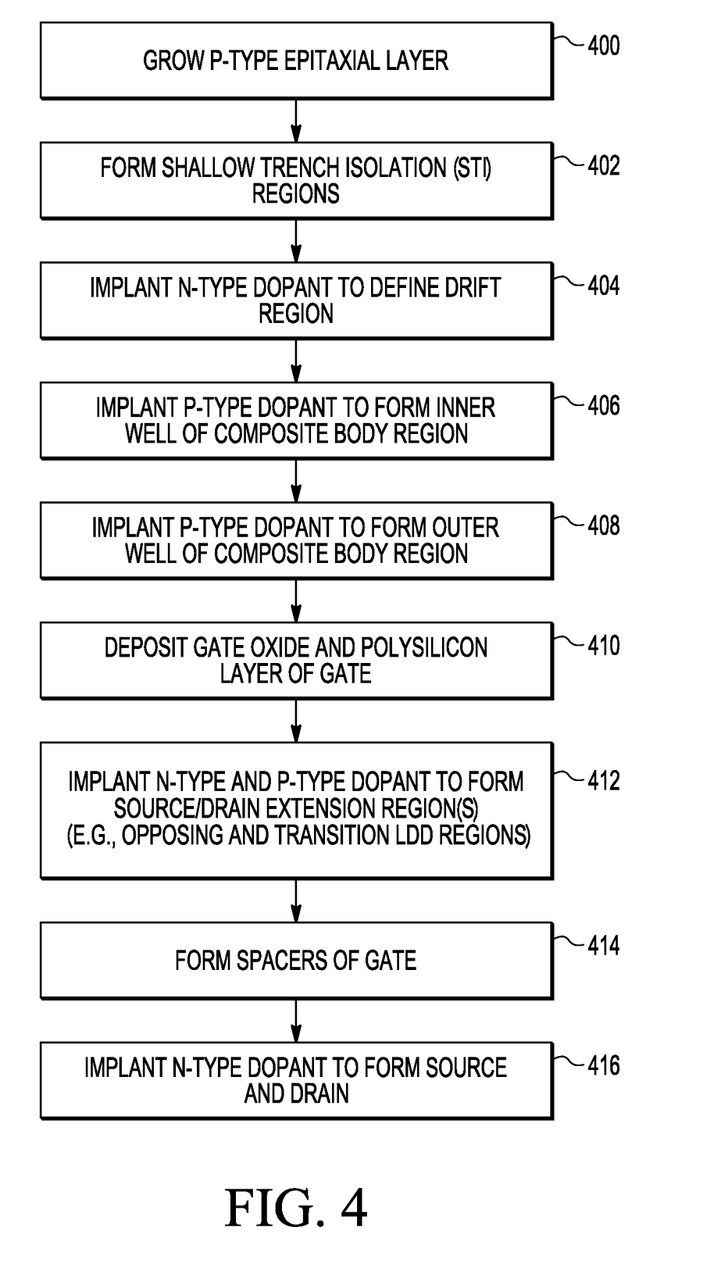
FIG. 4 is a flow diagram of an exemplary fabrication sequence to construct a semiconductor device having an increased SOA in accordance with one embodiment.

FIG. 4 shows an exemplary fabrication method for fabricating a semiconductor device with an improved SOA as described above. The method may be directed to fabricating a transistor device, such as a power FET device (e.g., an LDMOS device) having one or more of the features described above. The transistor device is fabricated with a semiconductor substrate, the regions or layers of which may have the conductivity types of the n-channel examples described above, or be alternatively configured to support a p-channel device. The method includes a sequence of acts, only the salient of which are depicted for convenience in illustration. The ordering of the acts may vary in other embodiments. For example, the drift region may be formed after the composite body region. The fabrication method is not limited to any particular doping mechanism, and may include future developed doping techniques.

The method may begin with, or include, an act 400 in which a p-type epitaxial layer is grown on a heavily doped p-type semiconductor substrate. In some cases, the act 400 includes the formation via, e.g., ion implantation, of one or more buried device isolation layers before the growth of the epitaxial layer. The buried device isolation layer(s) may be configured via a mask to extend across an active area of the transistor device. In some cases, the act 400 includes the growth of another p-type epitaxial layer. Any number of epitaxial layers may be grown. Alternatively, no epitaxial layers are grown.

In this embodiment, a number of STI regions are formed in the substrate in act 402. The STI regions may include an STI region (or field isolation region) to define the field drift length, and an STI region to separate source and body contact regions. The STI regions may be formed via any now known or hereafter developed procedure. For example, the act 402 may include the formation of a trench and the deposition (e.g., chemical vapor deposition, or CVD) of one or more materials in the trench. In some embodiments, the trench is filled with silicon oxide. Additional or alternative materials may be deposited. In an alternative embodiment, one or more of the STI regions are formed after the drift region is formed.

In act 404, the substrate is doped to form a well in the epitaxial layer for the accumulation region and the drift region of the transistor device. The well is an n-type well in n-channel embodiments. The doping may include one or more n-type dopant implantation procedures. The characteristics of the well region may vary. For example, the well may be spaced from a well (e.g., an inner well) of the device body. The boundary of the well need not be line-on-line with a boundary of the device body as shown in the examples of FIGS. 1-3.

One or more wells of a composite body region may be formed in the substrate. In this embodiment, inner and outer wells of a composite body region are formed in acts 406 and 408 via separate doping procedures. The acts 406, 408 may include respective p-type implantation procedures. The outer well may have a higher dopant concentration than the inner well, as described above. The inner well is positioned such that a channel is formed in the inner well during operation. The outer well may be positioned adjacent the inner well to laterally extend across a portion of a source region, as described above. The lateral extent of the outer well may vary, as also described above. In some embodiments, the act 408 is not implemented, such that the composite body region includes only a single well.

The fabrication process may then include one or more procedures collectively shown in act 410 and directed to forming a gate structure. A gate oxide layer of the gate structure may be deposited or grown on a surface of the semiconductor substrate. A polysilicon or other conductive layer of the gate structure may then be deposited on the gate oxide layer. The layers of the gate structure may be patterned via various photolithography and etch procedures. Additional or alternative procedures may be implemented.

In act 412, one or more source/drain or current terminal extension regions are formed. The regions may be configured as a transition region of a conductivity type that matches the source and drain regions or as an opposing source extension region of an opposite conductivity type. Respective moderate implantation procedures may be implemented (e.g., n-type and p-type LDD implants). The opposing source extension region(s) may be configured as a body conduction path region that forms part of a secondary conduction path, as described above. In an n-channel embodiment, an opposing source extension region is formed by a p-type source/drain extension dopant implantation procedure, which may be used in p-channel transistor devices formed in the same substrate. The implantation procedure may be configured (e.g., via a mask) to position the body conduction path region in an area contiguous with and under the source region, which may not yet be formed. For example, the mask may be configured such that the body conduction path region(s) may extend laterally across only a portion of the source region, and/or partially under the gate, as described above. Different masks may be used for the source/drain extension regions to, for instance, space a source offset region from the channel, as described above.

In some embodiments, an n-type implantation procedure (e.g., an n-type LDD implant) may be implemented to define an extension or transition region of the source region. Unlike the implant for the opposing source extension region in some embodiments (see, e.g., the embodiments of FIGS. 1 and 2), the patterned layers of the gate structure may be used for alignment for an inner boundary of the source/drain extension. The n-type source extension may thus laterally extend under the gate structure after diffusion. The opposing source extension region may also use the gate structure for alignment in some embodiments, such as those having an LDD-based body conduction path region that extends under the gate structure similar to the region noted by the dotted line in FIG. 3.

In some embodiments, the n-type source/drain extension implant is not implemented to maximize the effects of the body conduction path. In some embodiments, the p-type source/drain extension implant is not implemented (e.g., when the secondary conduction path only includes an outer well, as described above).

In act 414, sidewall spacers of the gate structure are formed. The material(s), size, shape, and other characteristics of the sidewall spacers may vary.

Source and drain regions may then be formed in act 416 via a source/drain implantation procedure, using the gate structure for self-alignment of the source region. One or more n-type ion implantation procedures may be performed.

The above-described implantation procedures may be configured such that one or more body conduction path regions (e.g., a p-type LDD region) are disposed contiguous with and under the source region. The body conduction path region may, but need not, be or include an opposing source extension region having the same conductivity type as the composite body region. The opposing source extension region (or other body conduction path region) may laterally extend across a portion of the source region distal or spaced from the channel formed during operation.

Additional acts may be implemented at various points during the fabrication procedure. For example, one or more acts may be directed to defining an active area of the device. In some cases, such acts may include the formation of one or more device isolating wells, layers, or other regions. One or more metal layers may be deposited. Any number of additional STI regions may be formed.

In a first aspect, a semiconductor device includes a semiconductor substrate having a surface, a composite body region disposed in the semiconductor substrate, having a first conductivity type, and including a body contact region at the surface of the semiconductor substrate and a well in which a channel is formed during operation, a source region disposed in the semiconductor substrate adjacent the composite body region and having a second conductivity type, and an isolation region disposed between the body contact region and the source region. The composite body region further includes a body conduction path region contiguous with and under the source region and the body conduction path region has a higher dopant concentration level than the well.

In a second aspect, an electronic apparatus includes a substrate, and a field-effect transistor device in the substrate. The field-effect transistor device includes a first semiconductor region having a first conductivity type and including a well in which a channel is formed during operation, and a second semiconductor region adjacent the first semiconductor region and having a second conductivity type. The first semiconductor region includes an opposing current terminal extension region contiguous with and under the second semiconductor region and having the first conductivity type. The current terminal extension region has a higher dopant concentration level than the well.

In a third aspect, a method of fabricating semiconductor device includes forming a well of a composite body region in a semiconductor substrate, the composite body region having a first conductivity type, wherein a channel is formed in the well during operation, forming a source region in the semiconductor substrate adjacent the composite body region and having a second conductivity type, and forming a body conduction path region of the composite body region with a dopant implantation configured to form an opposing source extension region having the first conductivity type, the body conduction path region being disposed contiguous with and under the source region.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A semiconductor device comprising:
a substrate having a surface;
a composite body region disposed in the substrate, having a first conductivity type, and comprising a body contact region at the surface of the substrate and a well in which a channel is formed during operation;
a source region disposed in the substrate adjacent the composite body region and having a second conductivity type; and
an isolation region disposed between the body contact region and the source region;
wherein:
the composite body region further comprises a body conduction path region contiguous with and under the source region;
the body conduction path region is electrically connected with the well; and
the body conduction path region has a higher dopant concentration level than the well.

2. The semiconductor device of claim 1, wherein:
the body conduction path region comprises a further well adjacent the body contact region; and
the further well has a higher dopant concentration level than the well in which the channel is formed.

3. The semiconductor device of claim 2, wherein the further well laterally extends across the isolation region and partially across the source region.

4. The semiconductor device of claim 1, wherein the body conduction path region extends across about an outer half of the source region, the outer half positioned distal from the channel.

5. The semiconductor device of claim 1, wherein a lateral spacing between the body conduction path region and the channel falls in a range from about 0.1 µm to about 0.3 µm.

6. The semiconductor device of claim 1, wherein:
the body conduction path region comprises a source offset region disposed adjacent and under the source region; and
the source offset region has a higher dopant concentration level than the well.

7. The semiconductor device of claim 1, wherein:
the body conduction path region comprises an opposing source extension region disposed adjacent and under the source region; and
the opposing source extension region has a higher dopant concentration level than the well.

8. The semiconductor device of claim 1, further comprising a gate structure supported by the substrate, wherein the body conduction path region includes a region that extends under the gate structure.

9. The semiconductor device of claim 1, wherein the source region lacks an extension region having the second conductivity type.

10. The semiconductor device of claim 1, wherein the isolation region comprises a shallow trench isolation (STI) region.

11. An electronic apparatus comprising:
a substrate; and
a field-effect transistor device in the substrate, the field-effect transistor device comprising:
a first semiconductor region having a first conductivity type and comprising a well in which a channel is formed during operation; and
a second semiconductor region adjacent the first semiconductor region, configured to act as a current terminal for the field-effect transistor device, and having a second conductivity type;
wherein:
the first semiconductor region comprises an opposing extension region, the opposing extension region being contiguous with and disposed under the second semiconductor region and having the first conductivity type, the opposing extension region being electrically connected with the well to establish a secondary conduction path for the field-effect transistor device; and
the opposing extension region has a higher dopant concentration level than the well.

12. The electronic apparatus of claim 11, wherein the opposing extension region extends across a portion of the second semiconductor region distal from the channel.

13. The electronic apparatus of claim 11, wherein the second semiconductor region lacks a current terminal extension region having the second conductivity type.

14. The electronic apparatus of claim 11, further comprising an isolation region at a surface of the substrate between the second semiconductor region and a contact region of the first semiconductor region.

15. The electronic apparatus of claim 14, wherein:
the first semiconductor region further comprises a further well adjacent the contact region;
the further well has a higher dopant concentration level than the well in which the channel is formed; and
the further well laterally extends across the isolation region and partially across the second semiconductor region.

16. The semiconductor device of claim 1, wherein the body conduction path region extends from the body contact region across an entire lateral extent of the isolation region.

17. The semiconductor device of claim 1, wherein the composite body region further comprises a further body conduction path region that electrically connects the body contact region and the well, the further body conduction path region having a higher dopant concentration level than the well.

18. The semiconductor device of claim 1, wherein:
the source region comprises a source extension region having the second conductivity type; and
the body conduction path region is contiguous with the source extension region and extends from the isolation region to the source extension region.

19. The semiconductor device of claim 1, wherein:
the source region comprises a source extension region having the second conductivity type; and
the body conduction path region comprises a region that extends from the body contact region and across the isolation region, and laterally overlaps the source extension region.

20. The semiconductor device of claim 1, wherein:
the source region comprises a source extension region having the second conductivity type;
the body conduction path region comprises:
a first region that extends from the body contact region and across the isolation region, laterally overlaps the source region, has a bottom deeper than the source extension region, and that electrically couples the body contact region and the well; and
a second region that extends from the isolation region to the source extension region; and
the first and second regions laterally overlap to be electrically connected with one another.

* * * * *